United States Patent [19]

Miller et al.

[11] Patent Number: 4,562,703
[45] Date of Patent: Jan. 7, 1986

[54] PLUG TUBE FOR NMR MAGNET CRYOSTAT

[75] Inventors: Russell S. Miller, Ballston Spa, N.Y.; Thomas E. Price, Ellendale, Del.

[73] Assignee: General Electric Company, Schenectady, N.Y.

[21] Appl. No.: 676,368

[22] Filed: Nov. 29, 1984

[51] Int. Cl.$^4$ .............................................. F25B 19/00
[52] U.S. Cl. .................................. 62/514 R; 165/181; 165/185
[58] Field of Search ............... 62/45, 514 R; 165/181, 165/185

[56] References Cited

U.S. PATENT DOCUMENTS

| | | | |
|---|---|---|---|
| 3,187,082 | 6/1965 | Allison | 165/185 |
| 3,193,610 | 7/1965 | Worden, Sr. | 165/185 |
| 3,483,709 | 12/1969 | Baicer et al. | 62/383 |
| 3,894,403 | 7/1975 | Longsworth | 62/55 |
| 4,223,540 | 9/1980 | Longsworth | 62/514 R |
| 4,277,949 | 7/1981 | Longsworth | 62/54 |
| 4,279,127 | 7/1981 | Longsworth | 62/77 |
| 4,344,302 | 8/1982 | Jarrett, Jr. et al. | 62/514 R |

OTHER PUBLICATIONS

Interfacing Small Closed-Cycle Refrigerators to Liquid Helium Cryostats, R. C. Longsworth, 1983.

*Primary Examiner*—Ronald C. Capossela
*Attorney, Agent, or Firm*—Lawrence D. Cutter; James C. Davis, Jr.; Marvin Snyder

[57] ABSTRACT

A vent tube which is particularly useful for horizontal cryostat penetration comprises a plurality of conduit sections joined by mating rings which facilitate the incorporation of relatively deep circumferential grooves in the conduit sections. Thermal contact springs, preferably in the form of a single strip are disposed in these circumferential grooves so as to provide a means for transfer of thermal energy from the cryostat interior to the exterior either for general refrigeration requirements or for liquefaction of coolant vapor which may have boiled off from the cryostat interior. The cryostat which incorporates the present invention is particularly useful in housing NMR medical diagnostic imaging magnet and coil systems.

12 Claims, 5 Drawing Figures

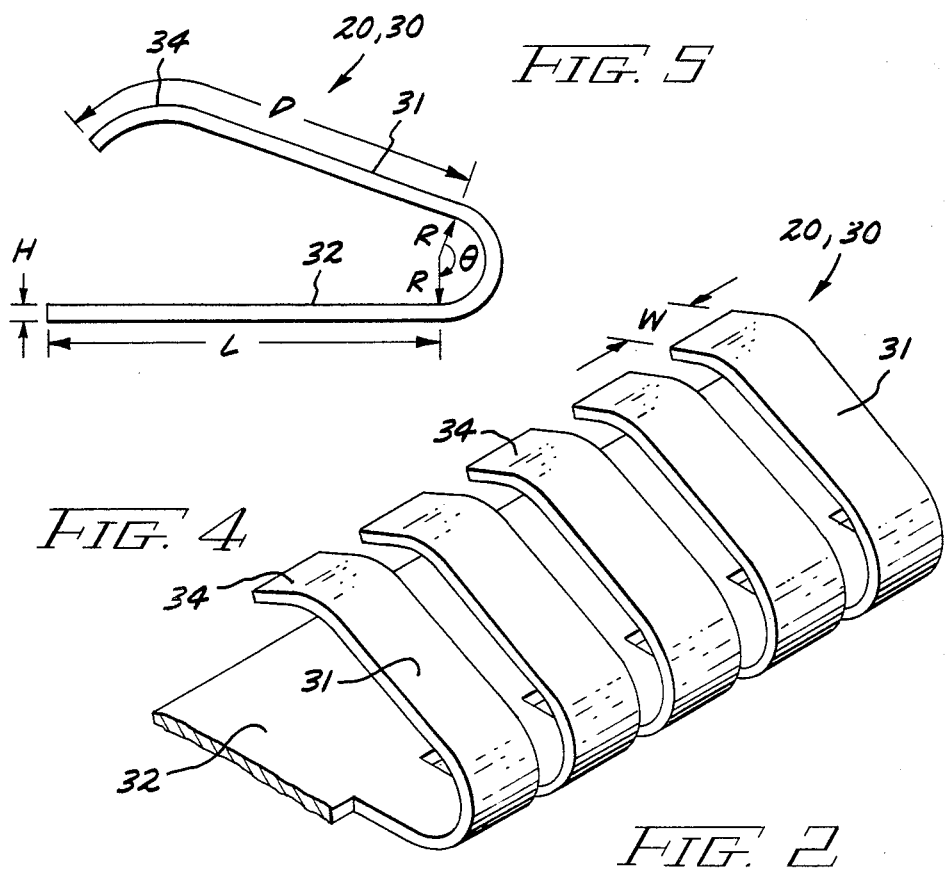
FIG. 5
FIG. 4
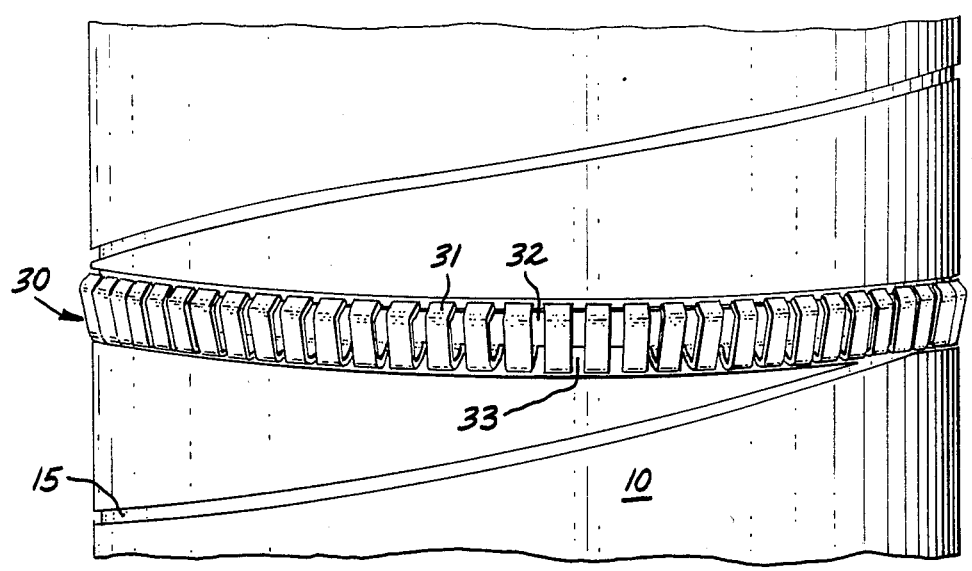
FIG. 2

PLUG TUBE FOR NMR MAGNET CRYOSTAT

BACKGROUND OF THE INVENTION

The present invention is generally directed to horizontal penetrations extending between the inner and outer walls of a cryostat, particularly a cryostat employing liquid helium as a coolant material. More particularly the present invention is directed to a plug tube employing heat transfer contacts to provide a refrigeration interface for a nuclear magnetic resonance (NMR) magnet cryostat.

In the generation of medical diagnostic images in NMR imaging, it is necessary to provide a temporally stable and spacially homogeneous magnetic field. The use of superconductive electrical materials maintained at cryogenic temperatures provides advantageous means to produce such a field. Accordingly, for such NMR imaging devices, a cryostat is employed. A cryostat contains an innermost chamber in which liquid helium, for example, is employed to cool the superconductive magnet materials. The cryostat itself, typically comprises a toroidal structure with other nested toroidal structures inside the exterior vessel to provide the desired vacuum conditions and thermal shielding. Since it is necessary to provide electrical energy to the main magnet coil, to various correction coils and to various gradient coils employed in NMR imaging, it is necessary that there be at least one penetration through the cryostat vessel walls.

Typical prior art penetrations have been vertical. While the apparatus of the present invention is particularly directed to non-vertical penetrations, it is also applicable to vertical ones. However, vertical penetrations have produced undesirable problems of alignment and assembly from a manufacturing viewpoint. Horizontal cryostat penetrations have, however, not been employed for reasons of thermal efficiency. In particular, it is seen that for a coolant such as liquid helium, there is a large dependency of gaseous or vapor density upon temperature. Accordingly, helium vapor found within a vertical penetration is naturally disposed in a layered configuration as a result of the density variation from the bottom to the top of the penetration. This layering provides a natural form of thermal insulation along the length of a vertical penetration. In particular, at any position along the axis of such a penetration, the temperature profile is substantially constant. However, this would not be the case for a conventional horizontal cryostat penetration since any layering that would exist would not be in the direction of the long axis of the cryostat penetration, that is, in the direction of the temperature gradient. Accordingly, the temperature gradient along the penetration would tend to set up free convection currents in the vapor within the penetration. This would result in a much more rapid loss of coolant than is desired. Since the cost of helium is relatively high, it is seen that this loss of coolant is undesirable.

However, cryostat plugs for horizontal penetrations have been designed so as to include special plug tubes with spiral grooves. These spiral grooves have been provided in a thin walled removable plug tube structure which is inserted into the cryostat penetration. Gasket material is disposed in the grooves so that a helical helium vapor path is provided along the axial length of the penetration with helium vapor flowing in the annular space defined between the plug tube and the cryostat penetration wall. This annular space must be closely controlled since the speed of helium vapor within the space determines in part the rate of heat loss from the cryostat. This annular space is typically about 1/100 of an inch wide. The spiral gas path for vaporized helium counteracts the natural convection currents that would otherwise be established in the annular volume.

However, along the axial length of the penetration it is desirable to be able to transfer a certain amount of thermal energy from certain cryostat vessel walls to the exterior environment. This is desired both for refrigerating various cryostat shields and also in those situations in which an exterior helium liquefier is provided to recycle helium vapor which is boiled off from the interior cryostat vessel or vessels. For example, it is desired to transfer between about 1 and 2 watts of thermal energy at an intermediate shield location which is maintained at a temperature of between about 10° K. and about 50° K. Additionally, it is desirable to be able to transfer between about 5 and about 10 watts of thermal energy at a more exterior shield which is maintained at a temperature of between about 50° K. and about 100° K. The annular gap, represents too large a thermal resistance for effective heat transfer. Additionally, the size of this gap and the relatively thin walled nature of the plug tube provides stringent limitations upon the size, strength and construction of any device that might be employed to improve local heat transfer conditions at the shield locations without adversely affecting either the size of the gap, strength of the tube or other thermal conditions. Additionally, the spiral gasketing material in the plug tube prevents any heat transfer augmentation device to be placed on a penetration tube wall where it would interfere with insertion of the plug. Also, during insertion and removal operations, air must be prevented from entering a penetration tube since there would be a tendency to form liquid or solid air condensate. Accordingly, a retractable disk or cylinder which slides in and out of a penetration tube is added to prevent entry of air after plug retraction. The retractable disk or cylinder generally requires a constant cross section tube in all practical construction designs.

Accordingly, the problem posed is briefly the following. A means is to be provided for localized thermal transfer across a high thermal resistance gap, typically filled with coolant vapors such as helium. The thermal transfer is to be localized at specific shield locations and cannot interfere with the insertion or removal of a plug tube partially defining the gap nor with the spiral flow of coolant vapor in the gap. Additionally, the desired thermal transfer structure must not interfere with the spiral gasketing material and must not interfere with the insertion and removal of the plug tube. Most critically, the thermal transfer means desired is to be employed in an extremely thin walled structure (15 to 25 mils) having significant length (approximately 14 inches) with respect to its diameter (approximately 3.5" in practice). Further reduction in the size of the annular gas gap, even locally, is not readily feasible because of the manufacturing tolerances involved. Additionally, significant increases in axial dimensions for the purpose of improved heat transfer area would significantly affect the overall dimensions of the entire cryostat structure and are generally considered to be economically prohibitive, particularly in light of the relatively inexpensive solution provided by the present invention.

SUMMARY OF THE INVENTION

In accordance with a preferred embodiment of the present invention a plug tube for a cryostat comprises at least two thin walled cylindrical conduit sections joined together by at least one ring disposed on the interior of the conduits so as to provide at least one circumferential groove for the disposition of a plurality of substantially U-shaped springs disposed within the grooves so that a long side of each spring is in thermal contact with the ring. This structure provides a mechanism which provides an adequate groove depth for the disposition of the thermal contact springs. This depth cannot be provided in the thin walled vent tube itself because of its thin walled nature. Additionally, the thermal contact springs must exhibit a certain width to prevent fracture and cracking at a small radius bend which would otherwise be required. The thermal contact springs are preferably provided in the form of a single strip of finger-like springs which are disposed directly in the groove formed by the conduit sections and the joining ring. In general, the circumferential groove may be made wide enough for a plurality of spring strips. Additionally, in general, circumferential grooves and spring strips are provided wherever thermal contact is needed between the plug tube body and a corresponding cryostat location.

Accordingly, it is an object of the present invention to provide a plug tube for a cryostat which includes thermal contact means at selected axial points along the tube.

It is also an object of the present invention to provide a plug tube for a cryostat which is capable of providing heat transfer from internal cryostat structures to the plug tube without interfering with a flow of coolant vapor in an annular gap surrounding the plug tube.

Additionally, it is an object of the present invention to provide a plug tube which is particularly useful with horizontal cryostat penetrations.

It is yet another object of the present invention to provide thermal contact means for a thin walled structure.

It is yet another object of the present invention to provide thermal contact means for a horizontal plug tube without decreasing the annular gap around the tube and without increasing the axial dimension of the penetration.

Lastly, but not limited hereto, it is an object of the present invention to allow the use of a horizontal plug tube plug as a refrigerator or liquefier interface for use in an NMR magnet cryostat.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2 is an enlarged view of a portion of FIG. 1 more particularly illustrating the thermal contact springs employed in the present invention;

FIG. 4 is an isometric view illustrating a portion of a strip of thermal contact springs which may be employed in the present invention; and FIG. 5 is a side elevation view of the spring strip shown in FIG. 4 more particularly illustrating various dimensions useful for heat flow and mechanical stress analysis.

DETAILED DESCRIPTION OF THE INVENTION

Figure 1:
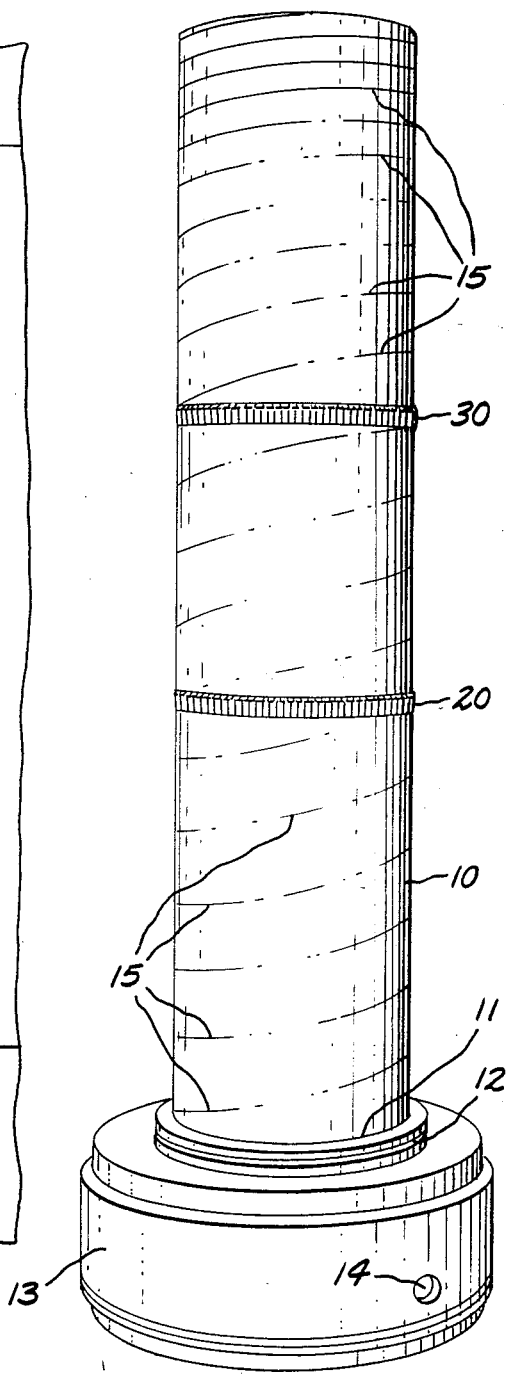
FIG. 1 is an isometric view illustrating a plug tube assembly in accordance with the present invention.

FIG. 1 illustrates a preferred embodiment of the present invention. In particular there is shown plug tube 10 with spiral grooves 15 and a pair of thermal contact springs 20 and 30 disposed within a circumferential groove. Plug tube 10 is disposed within plenum cap 13. Plenum cap 13 includes a channel with O-ring 12 for sealing against a mating cryostat portion. Additionally, there is also seen vapor gap 11 which exists between plug tube 10 and the visible portion of cap 13. Although not visible in FIG. 1 plug tube 10 is affixed to the interior bottom portion of plenum cap 13. Coolant vapor flows in a helical path around the circumference of plug tube 10 in paths that are defined by gasketing material (not shown) employed in grooves 15, between plug tube 10 and the inner wall of cryostat penetration tube 40 (see FIG. 3). Coolant vapor passes through gap 11 into plenum cap 13 and eventually exits from plenum aperture 14. In one embodiment of the present invention this vapor may be reliquefied and reintroduced into the cryostat. In this situation, the vent tube of the present invention provides an appropriate interface between the cryostat and external refrigeration and/or liquefaction equipment. It is also observed in FIG. 1 that the pitch of the spiral grooves varies along the tube axis. This pitch variation assists in preserving the desired axial temperature gradients along the plug tube.

Most relevant to the practice of the present invention, FIG. 1 illustrates the presence of thermal spring contact sets 20 and 30. These spring sets are disposed in circumferential grooves in vent tube 10. However, because of the extremely thin walled nature of plug tube 10 (approximately 20 mils in thickness) and because of the depth requirements for the spring material, the grooves in which the thermal contacts are disposed actually extend entirely through plug tube 10 so that plug tube 10 actually subsists in a plurality of coaxially disposed, cylindrical conduit sections. The sections of conduit are therefore actually held together by means of at least one underlying ring which supports the conduit sections and one or more spring strips. FIG. 2 provides a detailed view of this structure which is shown in even more detail in FIG. 3. In particular, in FIG. 2, spring contact set 30 is seen to be disposed in thermal contact with underlying joining ring 33.

Figure 3:
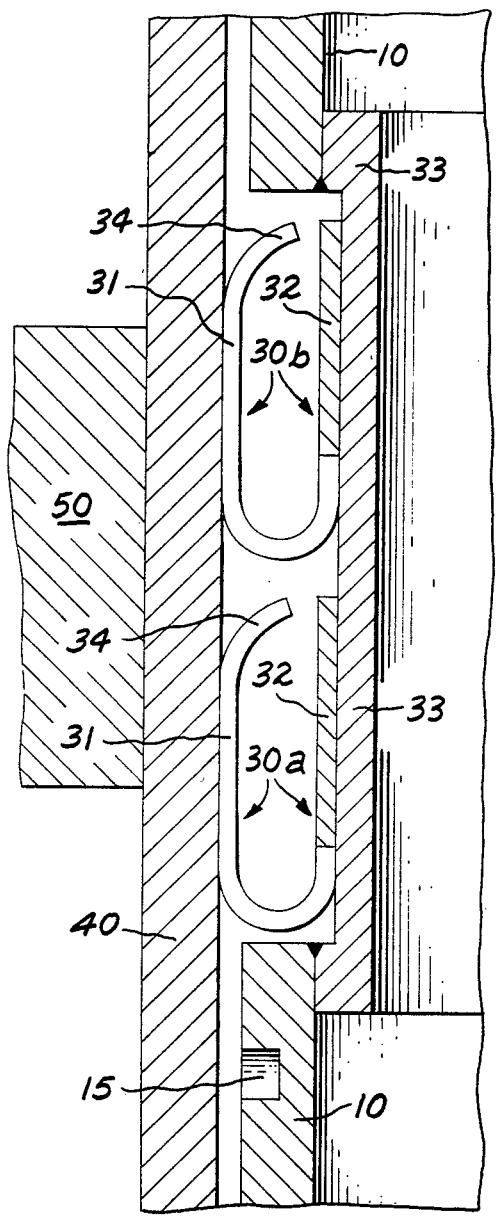
FIG. 3 is a cross-sectional side elevation view of a portion of the plug tube of the present invention shown in its operative position in a cryostat penetration.

This structure is more particularly illustrated in FIG. 3. However, FIG. 3 also illustrates an alternate embodiment of the present invention in which a pair of spring strips is disposed in the same circumferential groove. However, single spring strips have been found to be preferred because of their simpler structure. For a good understanding of FIG. 3 and the structure shown in FIGS. 1 and 2, the method of construction is considered. In particular, plug tube 10 is first provided with a set of spirally disposed grooves 15 extending approximately half way through the tube material. Such grooves do not significantly weaken the strength of plug tube 10. However, a circumferential groove in plug tube 10 of the desired depth would extend most if not all of the way through the vent tube itself. Accordingly, plug tube 10 is provided with a coaxially disposed joining ring 33 which is affixed to the inside of plug tube 10 at the desired location for the circumferential groove or grooves. Joining ring 33 is then affixed to plug tube 10 by any convenient means such as by brazing, welding, or the use of adhesive materials. With joining ring 33 in place a circumferential groove of appropriate depth is machined into plug tube 10, and also preferably at least partially into joining ring 33. Spring strips 20 and 30 are then disposed in their respective circumferential grooves and their ends attached so as to hold the strips in place. This joining is typically accomplished by soldering the common portion of the spring strip within the channel. Soldering is preferred so as to avoid annealing the spring strip material as a result of the high temperatures of brazing.

With an understanding of the method of constructing the plug tubes shown in FIGS. 1 and 2 in mind, the structure of FIG. 3 becomes clear. In particular, FIG. 3 illustrates joining ring 33 connecting a lower section of plug tube 10 to an upper section of plug tube 10. Brazed joints, added after the construction described above, are illustrated. Plug tube 10 is also seen disposed in its operative position within the cryostat and in particular within cryostat penetration tube 40. Spiral groove 15 is also visible in this view. Also visible are spring strips 30a and 30b. Each of these spring strips possesses common portion 32 which is in thermal contact with joining ring 33. Additionally, U-shaped spring members 31 are disposed so as to be in thermal contact with wall 40, which is in turn in thermal contact with internal cryostat shields 50. For example, shield 50 may be disposed at a temperature of between about 50° K. and 100° K. Accordingly, the desired thermal contact is provided across a gap which otherwise exhibits a high degree of thermal resistance, both because of its size and because of the vapor flowing therein. Additionally, it is seen that the thermal contact springs of the present invention do not in any way interfere with the flow of helium vapor along the defined helical path. It is also seen that the springs preferably possess bend 34 which facilitates their insertion and removal from the cryostat penetration.

FIG. 4 provides a detailed illustration of a portion of a spring set employable in the present invention. In particular, there is shown a set of U-shaped springs in an integral strip structure wherein one side of the U-shaped springs comprises an integral structure 32. Individual spring elements 31, each having a width W of between approximately 25 and 50 mils, are also seen to include a slight bend to facilitate insertion and removal of the penetration assembly.

Additional dimensional information with respect to a preferred embodiment of a strip employable in the present invention is shown in FIG. 5. In particular, the thickness H of the strip material is typically between approximately 6 and 12 mils. The strip extends for a distance L along the joining ring. L is between about typically ⅛ and ¼ inches. The length of the other side of the U-shaped spring contact is labeled D and is typically approximately the same length as L. R represents the radius of the U-bend and $\theta$ represents the angle subtended by the bend. In general R is between approximately 15 and 25 mils and $\theta$ is between approximately 165° and 170°.

In the preferred embodiment of the present invention, tube or conduit 10 preferably comprises a material such as stainless steel. However, glass fiber and epoxy composite materials may also be employed although they are generally less desirable. Joining ring 33 typically comprises a thermally conductive metal such as copper. The springs themselves preferably comprise a material such as beryllium copper or phosphor bronze. In general, joining ring 33 is affixed to the conduit sections by brazing. The springs deflect upon insertion to provide desired normal contact forces between tube 10 and wall 40. Since multiple prong type springs are preferred in the present invention to accommodate the curvature of the cryostat penetration wall, only a fraction of the total contact area is available. However, the gaps in the spring sets provide the required path for the continuation of the spiral gas flow.

Those skilled in the art will appreciate that while the above description has been provided under the assumption that the penetration exhibits a circular cross-section, that other cross-sections are possible. However, for ease of understanding and construction, cylindrical structures are preferred. Accordingly, as used herein and in the appended claims, the term tube or tubular is not restricted to objects exhibiting circular cross-sections, but also includes cylindrical (in its general sense) structures having oval, elliptical, square and similar cross-sections. Accordingly, it is seen that penetration cross sections that are other than strictly circular may be provided without departing from the principles of the present invention.

While the springs have been described herein as substantially U-shaped, it is intended herein and in the appended claims to include similar shaped springs, as for example, C-shaped springs.

From the above, it may be appreciated that the plug tube of the present invention provides a desirable solution to the problems encountered. In particular, excellent thermal contact is maintained without any interruption in the spiral flow path. Means are provided, principally through the incorporation of a joining ring to meet the requirements dictated by the small thickness of the plug tube itself. Additionally, plug tube plugs may be manufactured with the desired circumferential gap in various selected positions depending upon the cryostat geometry, and in particular upon the location of internal cryostat shield structures. The plug tube of the present invention is therefore seen to facilitate the interfacing of the internal cryostat environment with external refrigeration and liquefaction equipment as desired. Furthermore, the apparatus of the present invention is seen to meet all of the constraints imposed by the small size of the annular gap, limitations imposed by the material constraints and limitations imposed by the thermodynamics of cryostat design.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A plug tube for a cryostat, especially one for use with horizontal cryostat penetrations, said plug tube comprising:

at least two thin walled cylindrical conduit sections, said conduit sections being disposed coaxially;

at least one joining ring having an external surface in contact with the interior surfaces of the conduit sections, each said ring being sealably affixed between adjacent conduit sections so as to form a single cylindrical structure having at least one circumferential groove, said groove being substantially defined by the edges of said conduits and the outer surface of said joining ring; and a plurality of spaced apart, substantially U-shaped springs disposed within at least one of said circumferential grooves so that a long side of substantially most of said springs is in thermal contact with said ring.

2. The tube of claim 1 in which said thin walled cylindrical conduit sections have spiral grooves in their outer surface.

3. The plug tube of claim 2 in which the pitch of said spiral grooves varies.

4. The plug tube of claim 1 in which said springs are disposed in pairs in said circumferential grooves.

5. The plug tube of claim 1 in which said springs have a bend in the side thereof which is not in contact with said joining ring, so as to facilitate withdrawal from a mating cylinder in which it is insertable.

6. The plug tube of claim 1 in which said conduit comprises material selected from the group consisting of stainless steel and glass fiber composites.

7. The plug tube of claim 1 in which said springs comprise material selected from the group consisting of beryllium copper and phosphor bronze.

8. The plug tube of claim 1 in which each joining ring is affixed to its adjacent conduit section by brazing.

9. The plug tube of claim 1 in which said springs form an integral structure disposed in said circumferential groove as a strip.

10. The plug tube of claim 1 in which said ring comprises copper.

11. The plug tube of claim 1 in which said circumferential groove is formed in part in said joining ring.

12. The plug tube of claim 1 in which there are three thin walled cylindrical conduit sections and two joining rings.

* * * * *